United States Patent [19]

Uesaka

[11] Patent Number: 5,224,112
[45] Date of Patent: Jun. 29, 1993

[54] SEMICONDUCTOR LASER DEVICE DRIVING CIRCUIT

[75] Inventor: Katsumi Uesaka, Kanagawa, Japan

[73] Assignee: Sumitomo Electric Industries, Ltd., Osaka, Japan

[21] Appl. No.: 826,454

[22] Filed: Jan. 27, 1992

[30] Foreign Application Priority Data

Jan. 31, 1991 [JP] Japan .................................. 3-32030
Jan. 31, 1991 [JP] Japan .................................. 3-32032

[51] Int. Cl.⁵ .............................................. H01S 3/00
[52] U.S. Cl. ........................................ 372/38; 372/25; 372/29
[58] Field of Search ................. 372/26, 28, 29-32, 372/33, 38

[56] References Cited

FOREIGN PATENT DOCUMENTS

1229653 11/1987 Canada .
3404444 8/1984 Fed. Rep. of Germany ........ 372/38
4030995 1/1992 Fed. Rep. of Germany .
60-25335 2/1985 Japan .
61-42182 2/1986 Japan .
61-283237 12/1986 Japan .

Primary Examiner—Léon Scott, Jr.
Attorney, Agent, or Firm—Cushman, Darby & Cushman

[57] ABSTRACT

A semiconductor laser device driving circuit including a semiconductor laser device, a detection unit for detecting a luminous output of the semiconductor laser device, a reference current unit for providing reference currents for reference maximum and minimum values of the luminous output of the semiconductor laser device, and a driving unit for supplying currents to the semiconductor laser device so as to make maximum and minimum values of the luminous output of the semiconductor laser device detected by the detection unit coincident with the reference maximum and minimum values determined by the reference currents. In the semiconductor laser device driving circuit, the reference currents are given as differences between a plurality of currents supplied from current sources.

7 Claims, 8 Drawing Sheets

ROOM TEMPERATURE

HIGH TEMPERATURE

SEMICONDUCTOR LASER DEVICE DRIVING CIRCUIT

BACKGROUND OF THE INVENTION

1. Field of the Invention

The present invention relates to a semiconductor laser device driving circuit, and, more particularly, relates to a semiconductor laser device driving circuit of a light transmitter using a semiconductor laser device, used in a light communication system.

2. Discussion of the Related Art

Figure 1:
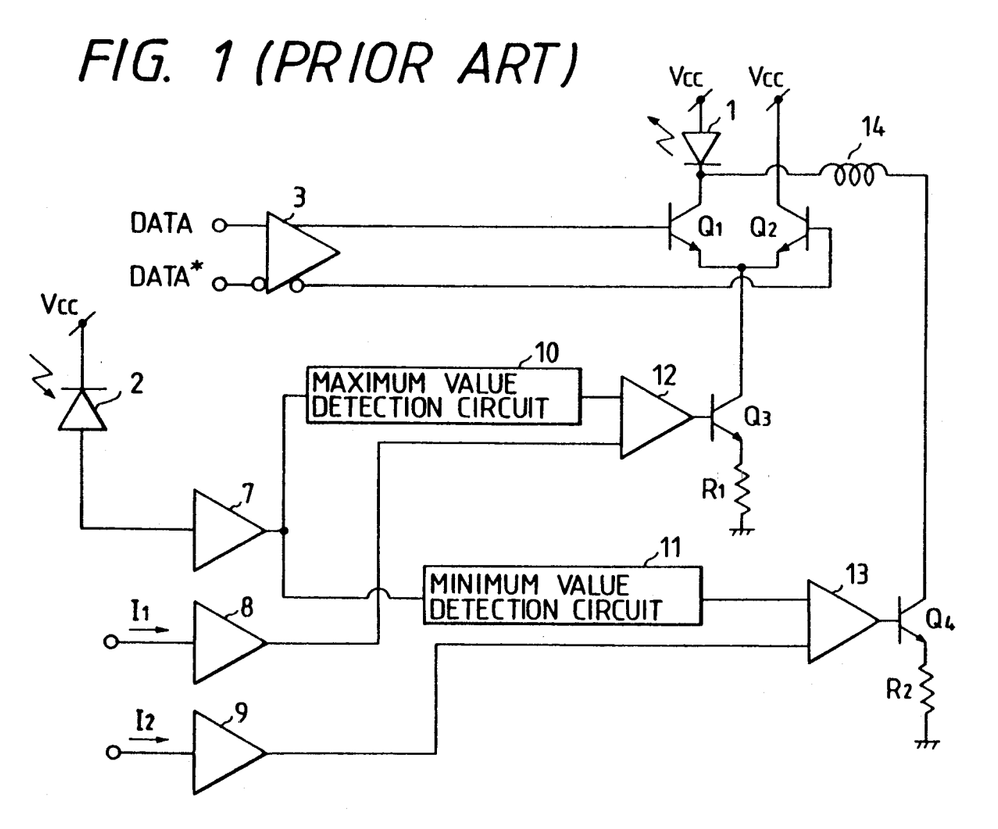
FIG. 1 (PRIOR ART) is a block diagram illustrating an example of a conventional semiconductor laser device driving circuit.

FIG. 1 (PRIOR ART) is a block diagram illustrating an example of a conventional semiconductor laser device driving circuit. The semiconductor laser device driving circuit in FIG. 1 is arranged so that output light of a laser diode 1 is monitored by a photodiode 2 and a current made to flow into the laser diode 1 is changed to make the maximum and minimum values of the luminous output of the laser diode 1 always constant. The semiconductor laser device driving circuit having such a configuration intends to correct reduction of the luminous output of the laser diode 1 as the temperature increases during the operation thereof. That is, in the semiconductor laser device driving circuit in FIG. 1, an input signal DATA and an inverted input signal DATA* (the mark * represents an inverted signal) are applied to the respective bases of transistors $Q_1$ and $Q_2$ through a buffer amplifier 3. The laser diode 1 is inserted in the forward direction between a power supply $V_{cc}$ and the collector of the transistor $Q_1$.

The collector of the transistor $Q_1$ is connected to the collector of a transistor $Q_4$ through a coil 14, and the collector of the transistor $Q_2$ is connected to the power supply $V_{cc}$. The respective emitters of the transistors $Q_1$ and $Q_2$ are connected to the collector of a transistor $Q_3$ in common, and the emitter of the transistor $Q_3$ is connected to the ground through a resistor $R_1$.

An amplifier 7 amplifies the output of the photodiode 2 and a maximum value detection circuit 10 is supplied with the output of the amplifier 7. An amplifier 8 current-to-voltage converts a reference current $I_1$. A differential amplifier 12 is supplied with the respective outputs of the maximum value detection circuit 10 and the amplifier 8, and the output of the differential amplifier 12 is applied to the base of the transistor $Q_3$. On the other hand, a minimum value detection circuit 11 is supplied with the output of the amplifier 7. An amplifier 9 current-to-voltage converts a reference current $I_2$. A differential amplifier 13 is supplied with the respective outputs of the minimum value detection circuit 11 and the amplifier 9, and the output of the differential amplifier 13 is applied to the base of the transistor $Q_4$, the emitter of which is connected to the ground through a resistor $R_2$. Further, one end of the photodiode 2 is connected to the power supply $V_{cc}$.

In the above-mentioned semiconductor laser device driving circuit, the value of a modulation current made to flow into the laser diode 1 is determined by the output of the differential amplifier 12 supplied with the maximum value of the output current of the photodiode 2 and the reference current $I_1$. In addition, the value of a bias current made to flow into the laser diode 1 is determined by the output of the differential amplifier 13 supplied with the minimum value of the output current of the photodiode 2 and the reference current $I_2$. Therefore, as for the luminous output of the laser diode 1, the maximum and minimum light outputs thereof are determined by the reference currents $I_1$ and $I_2$ respectively, and the average light output and extinction ratio thereof are determined by the reference currents $I_1$ and $I_2$.

In the above-mentioned conventional semiconductor laser device driving circuit, the very small reference currents $I_1$ and $I_2$ which determine the luminous output of the laser diode 1 are current-to-voltage converted, and directly supplied to the differential amplifiers 12 and 13 respectively. Since the reference currents $I_1$ and $I_2$ are very small currents, they are apt to be affected by fluctuations in voltage of the power supply, external noises or the like so that their current values are changed easily. There is therefore a problem that the laser light output is likely to be changed because of fluctuations in voltage of the power supply, external noises or the like.

SUMMARY OF THE INVENTION

It is therefore an object of the present invention to provide a semiconductor laser device driving circuit in which the foregoing problem is solved so that the laser light is generated as a stable output.

A semiconductor laser device driving circuit according to the present invention includes a semiconductor laser device; detection means for detecting a luminous output of the semiconductor laser device; reference current means for providing reference currents for reference maximum and minimum values of the luminous output of the semiconductor laser device, the reference currents being given as differences between a plurality of currents supplied from current source means; and driving means for supplying currents to the semiconductor laser device so as to make maximum and minimum values of the luminous output of the semiconductor laser device detected by the detection means coincident with the reference maximum and minimum values determined by the reference currents.

DETAILED DESCRIPTION OF THE PREFERRED EMBODIMENTS

Figure 2:
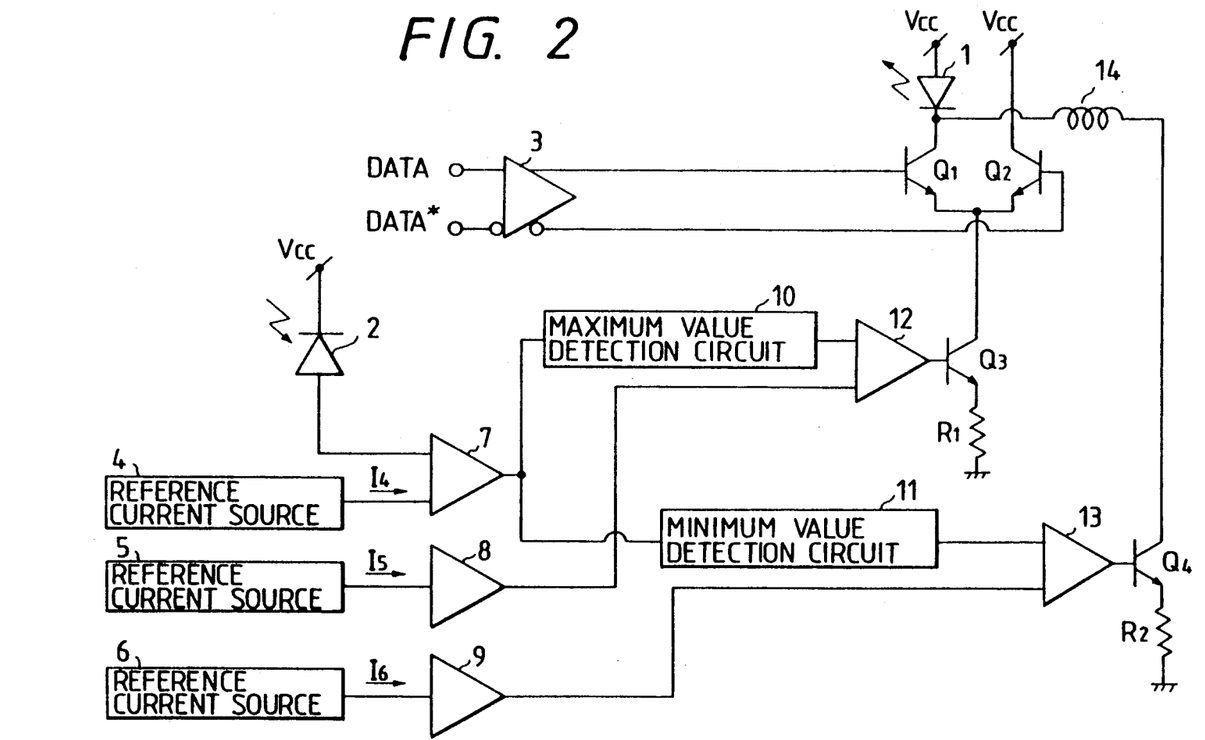
FIG. 2 is a block diagram illustrating an embodiment of the semiconductor laser device driving circuit according to the present invention.

FIG. 2 is a block diagram illustrating an embodiment of the semiconductor laser device driving circuit according to the present invention. The semiconductor laser device driving circuit in FIG. 2 is configured in the same manner as the conventional semiconductor laser device driving circuit shown in FIG. 1, so that the output light of a laser diode 1 is monitored by a photodiode 2, and a current made to flow into the laser diode 1 is controlled to make the maximum and minimum values of the luminous output of the laser diode 1 always constant. Therefore, the constituent elements which are the same as those in the semiconductor laser device driving circuit of FIG. 1 are referenced correspondingly, and the description hereinafter will be made mainly along the different points from the semiconductor laser device driving circuit of FIG. 1.

In the semiconductor laser device driving circuit of FIG. 2, a differential amplifier 12 is supplied with the output of a maximum value detection circuit 10 and the output of an amplifier 8. The maximum value detection circuit 10 is supplied with the output of an amplifier 7 which is supplied with the output of the photodiode 2 and an output current $I_4$ of a reference current source 4. The amplifier 8 is supplied with an output current $I_5$ of a reference current source 5.

On the other hand, a differential amplifier 13 is supplied with the output of a minimum value detection circuit and the output of an amplifier 9. The minimum value detection circuit 11 is supplied with the output of the amplifier 7 which is supplied with the output of the photodiode 2 and the output current $I_4$ of the reference current source 4. The amplifier 9 is supplied with an output current $I_6$ of a reference current source 6. In addition, the emitter of a transistor $Q_4$ is connected to the ground through a resistor $R_2$. One end of the photodiode 2 is connected to a power supply $V_{cc}$.

In the semiconductor laser device driving circuit having the above configuration, a modulation current of the laser diode 1 is determined on the basis of a current which is the difference between the currents $I_4$ and $I_5$ as a reference current, and a bias current of the laser diode 1 is determined on the basis of a current which is the difference between the currents $I_4$ and $I_6$ as a reference current. Therefore, if the reference current sources 4 to 6 are affected by the fluctuation in voltage of the power supply, external noises or the like, the currents $I_4$ to $I_6$ are changed in the same direction and by almost the same quantity, so that the differences between the currents $I_4$ and $I_5$ and between the currents $I_4$ and $I_6$ barely changes. Accordingly, the reference currents of the modulation current and the bias current of the laser diode 1 barely change. Therefore, in the semiconductor laser device driving circuit according to the present invention, the luminous output of the laser diode is made stable.

Figure 3:
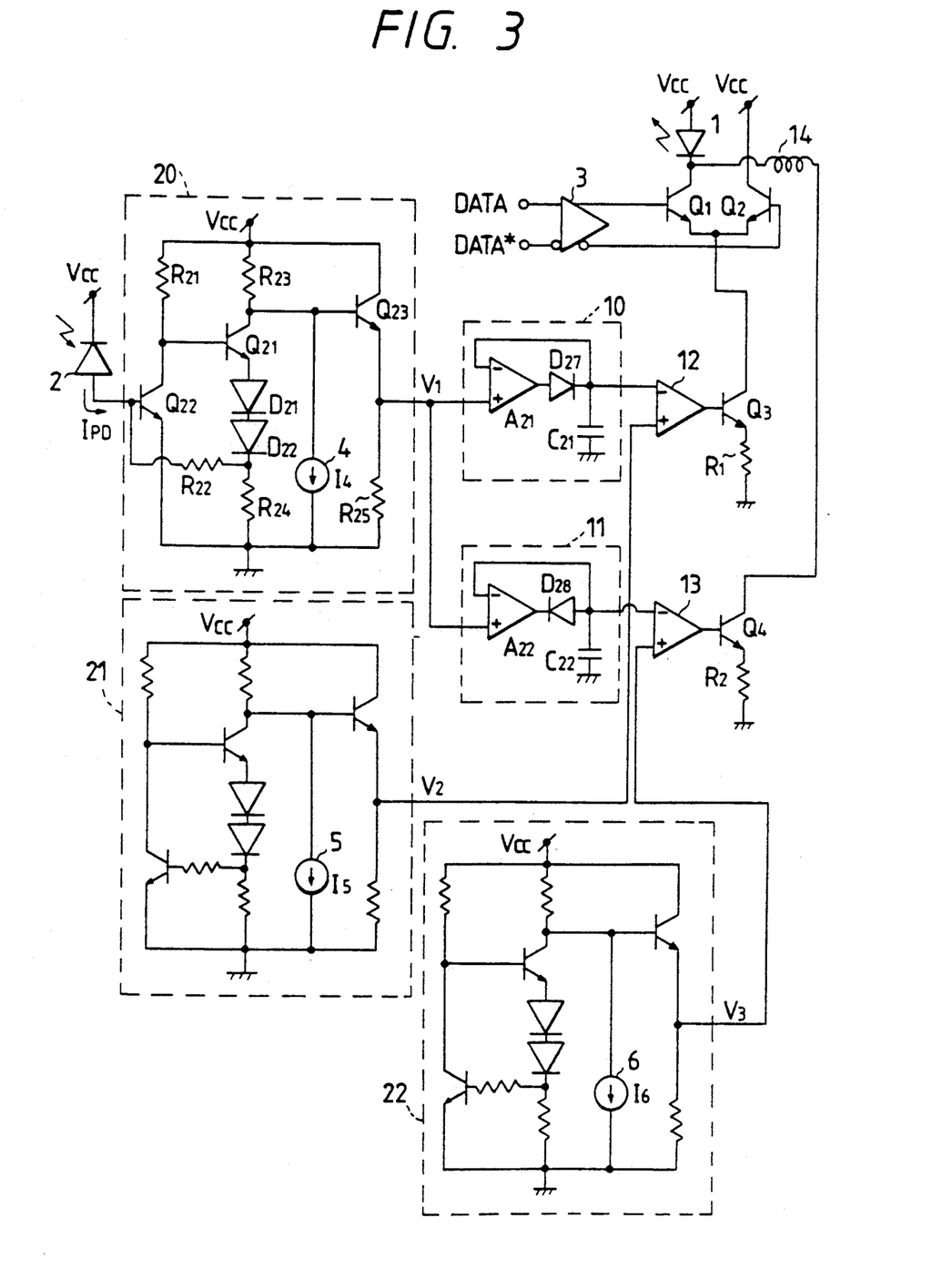
FIG. 3 is a circuit diagram illustrating an example of a more specific configuration of the semiconductor laser device driving circuit shown in FIG. 2.

FIG. 3 shows an example of a more specific configuration of the semiconductor laser device driving circuit shown in FIG. 2. In the semiconductor laser device driving circuit of FIG. 3, the reference current sources 4 to 6, the amplifiers 7 to 9, the maximum value detection circuit 10 and the minimum value detection circuit 11 are illustrated more in detail than those illustrated in the semiconductor laser device driving circuit of FIG. 2. Therefore, both the embodiments of FIGS. 2 and 3 are the same in basic configuration, so that the same constituent elements are referenced correspondingly. To avoid repetition, hereinafter, portions of the semiconductor laser device driving circuit of FIG. 3 different from those of FIG. 2 will be described mainly.

In the semiconductor laser device driving circuit of FIG. 3, a photodiode 2 is inserted between the power supply $V_{cc}$ and the base of a transistor $Q_{22}$ in a transfer impedance type pre-amplifier 20 for current/voltage conversion. The collector of the transistor $Q_{22}$ is connected to the power supply $V_{cc}$ through a resistor $R_{21}$, and the emitter of the same is connected to the ground. The base of a transistor $Q_{21}$ is connected to the collector of the transistor $Q_{22}$. In addition, the collector of the transistor $Q_{21}$ is connected to the power supply $V_{cc}$ through a resistor $R_{23}$, and the emitter of the same is connected to the ground through a pair of diodes $D_{21}$ and $D_{22}$ connected in series in the forward direction and through a resistor $R_{24}$. The base of a transistor $Q_{23}$ is connected to the collector of the transistor $Q_{21}$. The collector of the transistor $Q_{23}$ is connected to the power supply $V_{cc}$, and the emitter of the same is connected to the ground through a resistor $R_{25}$. A reference current source 4 which flows a reference current $I_4$ is connected between the base of the transistor $Q_{23}$ and the ground. In addition, the base of the transistor $Q_{22}$ is connected between the diode $D_{22}$ and the resistor $R_{24}$ through a resistor $R_{22}$.

Amplifiers 21 and 22 are dummies of the pre-amplifier 20, and the amplifiers 21 and 22 include reference current sources 5 and 6 for flowing reference currents $I_5$ and $I_6$ respectively. In addition, the amplifiers 21 and 22 have the same configuration as that of the pre-amplifier 20, except that they do not receive the output of the photodiode 2. Accordingly, the description of the amplifiers 21 and 22 will be omitted.

A maximum value detection circuit 10 includes a differential amplifier $A_{21}$ the positive input terminal of which is supplied with the output of the pre-amplifier 20, and the output terminal of which is connected to the ground through a forward-connected diode $D_{27}$ and a capacitor $C_{21}$. The negative input terminal of the differential amplifier $A_{21}$ is connected between the diode $D_{27}$ and the capacitor $C_{21}$.

A minimum value detection circuit 11 includes a differential amplifier $A_{22}$ the positive input terminal of which is supplied with the output of the pre-amplifier 20 and the output terminal of which is connected to the ground through a reversely-connected diode $D_{28}$ and a capacitor $C_{22}$. The negative input terminal of the differential amplifier $A_{22}$ is connected between the diode $D_{28}$ and the capacitor $C_{22}$.

In the above-mentioned semiconductor laser device driving circuit according to the present invention, assuming the base-emitter voltage of the transistor $Q_{23}$ is $V_{BE}$, then the output voltage $V_1$ of the amplifier 20 is expressed by:

$$V_1 \simeq V_{cc} - V_{BE}(R_{23}/R_{24} + 1-) + I_{PD}R_{23}(R_{22}+R_{24})/R_{24} - I_4 R_{23}$$

The output voltage $V_2$ of the dummy amplifier 21 is expressed by:

$$V_2 \simeq V_{cc} - V_{BE}(R_{23}/R_{24} + 1) - I_5 R_{23}$$

The output voltage $V_3$ of the dummy amplifier 22 is expressed by:

$$V_3 \approx V_{cc} - V_{BE}(R_{23}/R_{24}+1) - I_6 R_{23}$$

The input voltage $V_{in12}$ of the differential amplifier 12 is therefore expressed by:

$$V_{in12} = R_{23}(I_4 - I_5) - I_{PDmax} R_{23}(R_{22} + R_{24})/R_{24} \quad (1)$$

The input voltage $V_{in13}$ of the differential amplifier 13 is expressed by:

$$V_{in13} = R_{23}(I_4 - I_6) - I_{PDmin} R_{23}(R_{22} + R_{24})/R_{24} \quad (2)$$

Consequently, in the above-mentioned semiconductor laser device driving circuit according to the present invention, the reference currents which determine the demodulation current and the bias current made to flow into the laser diode 1 are $[R_{24}/(R_{22}+R_{24})]$ folds of $(I_4-I_5)$ and $(I_4-I_6)$ respectively.

In the above-mentioned semiconductor laser device driving circuit, if the maximum and minimum values of the laser light output of the laser diode 1 are affected by changes in temperature or the like during operation, the maximum and minimum values $I_{PDmax}$ and $I_{PDmin}$ of the output current of the photodiode 2 are changed respectively. If the $I_{PDmax}$ and $I_{PDmin}$ are changed, the modulation current and the bias current of the laser diode 1 are changed in the direction to eliminate the change of the laser light output of the laser diode 1 according to the expressions (1) and (2), so that the laser light output is made stable. In addition, if the reference currents $(I_4-I_5)$ and $(I_4-I_6)$ are adjusted, it is possible to establish the laser light output of the laser diode 1 desirably.

In addition, in the above-mentioned semiconductor laser device driving circuit according to the present invention, if the voltage of the power supply fluctuates or external noises are produced, the reference current sources 4 to 6 receive the same influence so that their output reference currents $I_4$ to $I_6$ change equally. On the other hand, the modulation current and the bias current of the laser diode 1 are determined with reference to $(I_4-I_5)$ and $(I_4-I_6)$ as mentioned above, so that they receive no influence from the fluctuation in voltage of the power supply or external noises. Therefore, the laser light output is supplied with no influence of disturbance, and becomes more stable.

As has been described above, in the semiconductor laser device driving circuit according to the present invention, it is possible not only to prevent the laser light output from decreasing in company with temperature rising during operation, but also to suppress the laser light output from fluctuating because of the fluctuation in voltage of the power supply or external noises. It is therefore effective particularly to use the semiconductor laser device driving circuit according to the present invention as a driving circuit of a laser transmitter in the field of light communication.

Further, in the case of stopping the light emitting operation of the laser device compulsorily, the light emitting operation can be stopped by making only the reference current $I_4$ zero. Therefore, the circuit configuration can be simplified.

Furthermore, when the laser device is turned on after a turn-off period thereof, the laser device can be prevented from being destroyed to increase the reliability because the circuits having a long time constant such as the maximum value detection circuit and the minimum value detection circuit are provided at the stages following the current sources.

Figure 4:
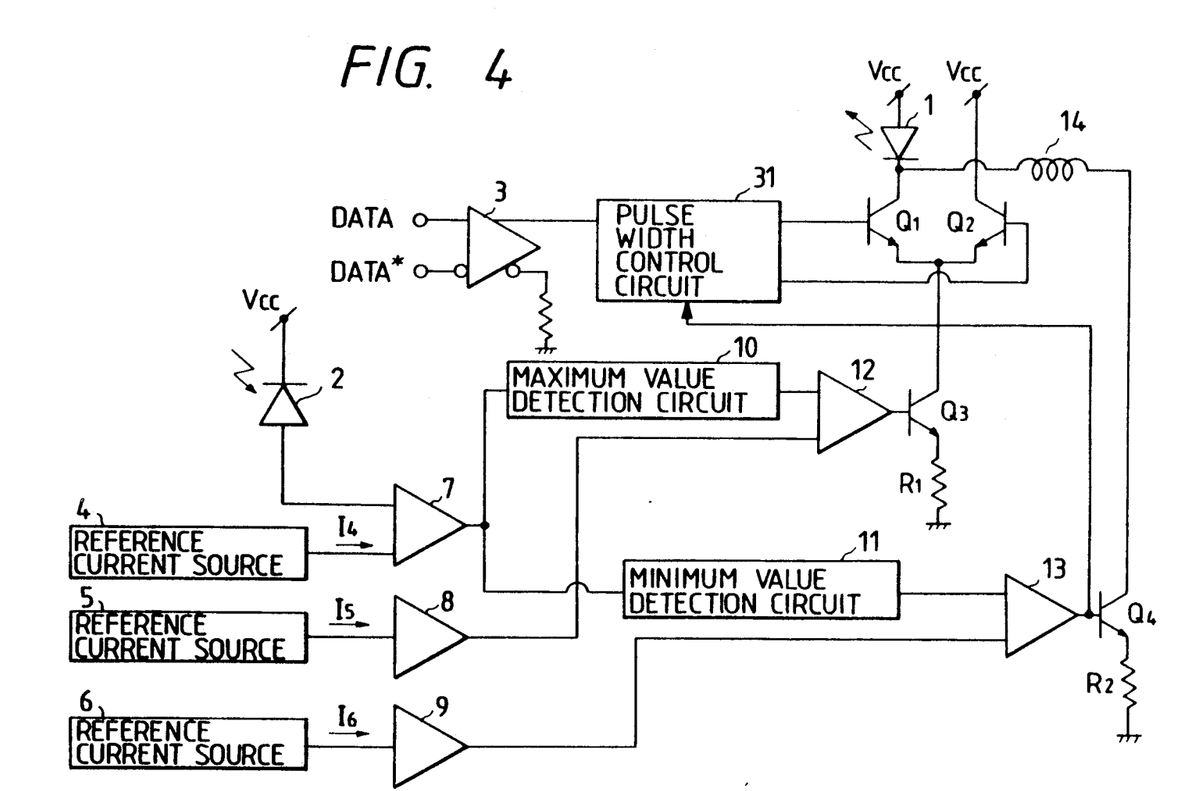
FIG. 4 is a block diagram illustrating another embodiment of the semiconductor laser device driving circuit according to the present invention.

FIG. 4 is a block diagram illustrating another embodiment of the semiconductor laser device driving circuit according to the present invention. The circuit of this embodiment has a similar configuration to the circuit shown in FIG. 2, while a pulse width control circuit 31 is additionally provided as shown in FIG. 4. Therefore, the description will be made mainly about the pulse width control circuit 31 hereinafter.

An input signal DATA is supplied to the pulse width control circuit 31 through the buffer amplifier 3, and output signals from the pulse width control circuit 31 are supplied to the respective bases of the transistors $Q_1$ and $Q_2$. Further, the output signal from the differential amplifier 13 is supplied to the pulse width control circuit 31.

According to the above-mentioned semiconductor laser device driving circuit, it is possible not only to suppress the laser light output from fluctuating because of the fluctuation in voltage of the power supply or external noises, but also to effectively correct a waveform distortion of the output light signal caused by the temperature characteristic of the semiconductor laser device.

Figure 5:
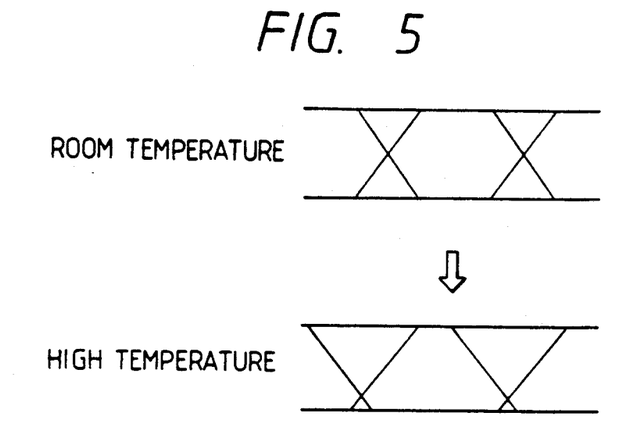
FIG. 5 is a signal waveform diagram for explaining the fluctuation of an output light signal caused by a temperature change.

For example, in the semiconductor laser device driving circuit shown in FIG. 2, if the temperature of the laser diode 1 rises, cross points of the waveform of the output light signal may be shifted to cause a waveform distortion as shown in FIG. 5.

The semiconductor laser device driving circuit shown in FIG. 4 is arranged to feedback-control the pulse width of the modulation current to be modulated with the input signal DATA with reference to the output of the differential amplifier 13. That is, when the minimum value of the output light signal from the laser diode 1 decreases, the pulse width control circuit 31 increases the pulse width of the modulation current supplied to the laser diode 1, and on the contrary, when the minimum value of the output light signal from the laser diode 1 increases, the pulse width control circuit 31 decreases the pulse width of the modulation current supplied to the laser diode 1. Accordingly, the waveform distortion of the output light signal due to the temperature characteristic of the laser diode 1 can be corrected effectively.

Figure 6:
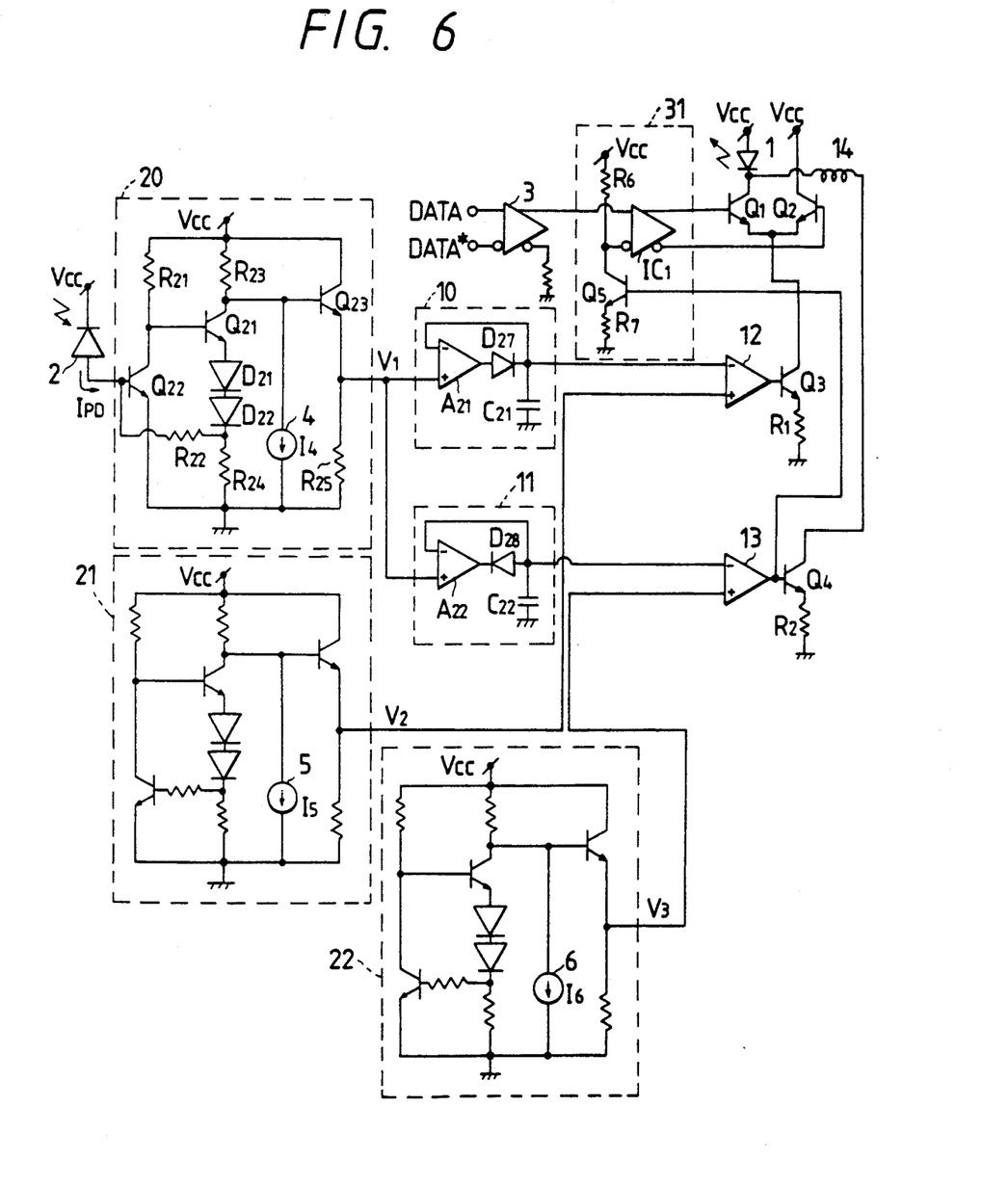
FIG. 6 is a circuit diagram illustrating an example of a more specific configuration of the semiconductor laser device driving circuit shown in FIG. 4.

FIG. 6 is a circuit diagram illustrating an example of a more specific configuration of the semiconductor laser device driving circuit shown in FIG. 4. The circuit of FIG. 6 has a similar configuration to that of the circuit shown in FIG. 3, while the pulse width control circuit 31 is additionally provided.

The pulse width control circuit 31 includes a differential amplifier $IC_1$ for producing signals complementary to each other on the basis of an input signal DATA applied to its positive input. The complementary signals in pair outputted from the differential amplifier $IC_1$ are supplied to the bases of the transistors $Q_1$ and $Q_2$. Further, a reference voltage defined by the transistor $Q_5$ is applied to the negative input terminal of the differential amplifier $IC_1$.

The transistor $Q_5$ is connected between the power supply $V_{cc}$ and the ground in series together with resistors $R_6$ and $R_7$, and arranged to apply a voltage produced between the resistor $R_6$ and the transistor $Q_5$ to the negative input terminal of the differential amplifier $IC_1$ correspondingly to a voltage applied to the base of the transistor $Q_5$. Further, the output signal of the differential amplifier 13 is supplied to the base of the transistor $Q_5$.

In the above-mentioned semiconductor laser device driving circuit, when the minimum value of the output light signal of the laser diode 1 decreases, the voltage applied to the negative input terminal of the differential amplifier $IC_1$ is reduced, and the pulse width of the input signal supplied from the differential amplifier $IC_1$ becomes large. On the contrary, when the minimum value of the output light signal of the laser diode 1 increases, the voltage applied to the negative input terminal of the differential amplifier $IC_1$ increases, and the pulse width of the signal supplied from the differential amplifier $IC_1$ becomes small.

Figure 7:
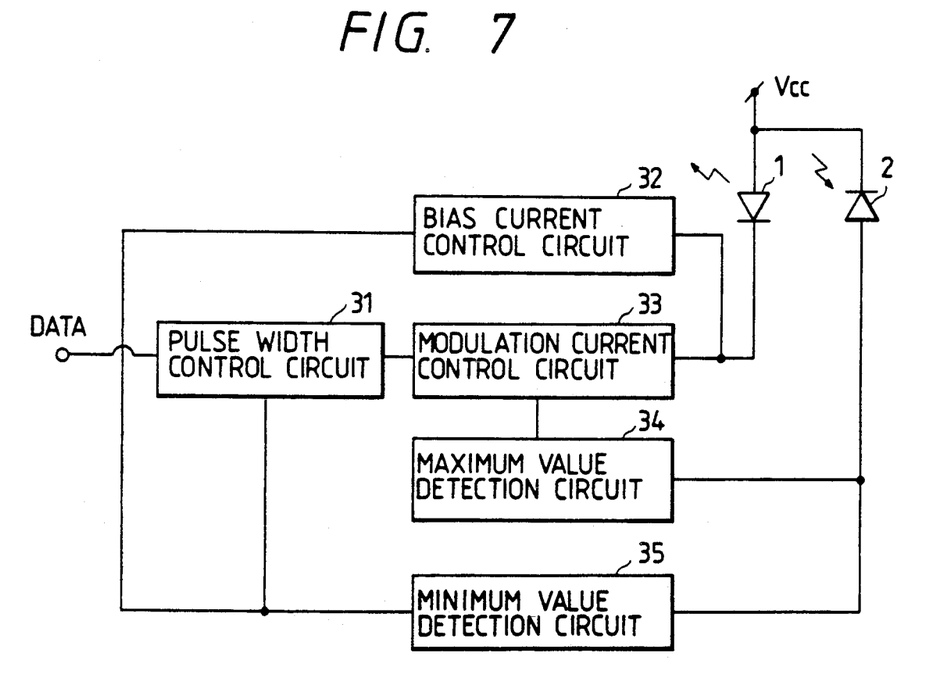
FIG. 7 is a block diagram illustrating a basic structure of a semiconductor laser device driving circuit in the case where no consideration of any reference current source is required.
Figure 8:
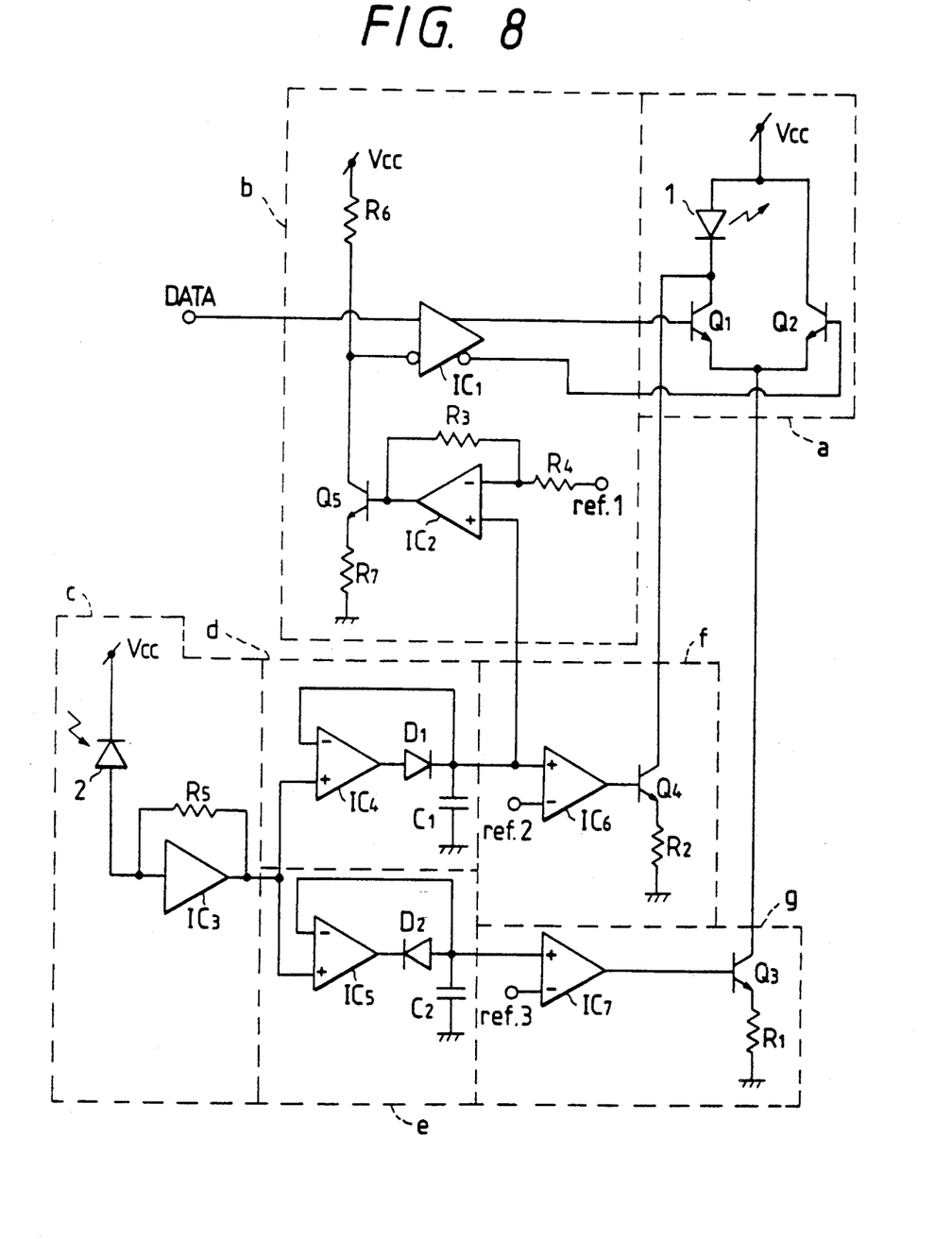
FIG. 8 is a circuit diagram illustrating an example of a more specific configuration of the semiconductor laser device driving circuit shown in FIG. 7.

In the case where no consideration of any reference current source is required, circuits shown in FIGS. 7 and 8 may be used. Here, FIG. 8 is a circuit diagram illustrating an example of a more specific configuration of the circuit shown in FIG. 7.

As shown in FIG. 7, this semiconductor laser device driving circuit is constituted mainly by a pulse width control circuit 31 for controlling the pulse width of the modulation current of a laser diode 1, a bias current control circuit 32 for supplying a bias current to the laser diode 1, a photodiode 2 for monitoring a light signal supplied from the laser diode 1, a maximum value detection circuit 34 for extracting the maximum value from a monitor signal supplied from the photodiode 2, and a minimum value detection circuit 35 for extracting the minimum value from the same monitor signal. Further, a modulation current control circuit 33 receives an input signal DATA through the pulse width control circuit 31.

Further, as shown in FIG. 8, this semiconductor laser device driving circuit is constituted mainly by a driving circuit a for supplying a modulation current to a laser diode 1, a pulse width control circuit b for producing an input signal to the driving circuit a and for controlling the pulse width of the input signal, a monitor circuit c supplied with an output light signal of the laser diode 1 and for outputting a monitor signal, a minimum value detection circuit d and a maximum value detection circuit e supplied with the monitor signal, a bias current control circuit f supplied with the output of the minimum value detection circuit d and for supplying a bias current to the driving circuit a, and a modulation current control circuit g supplied with the output of the maximum value detection circuit e and for supplying a modulation current to the driving circuit a.

The driving circuit a is constituted by a pair of transistors $Q_1$ and $Q_2$ the emitters of which are connected to each other, and a laser diode 1 connected so as to be a load to the transistor $Q_1$.

The pulse width control circuit b includes a differential amplifier $IC_1$ for producing signals complementary to each other on the basis of input signal DATA applied to its positive input terminal. The complementary signals in pair outputted from the differential amplifier $IC_1$ are supplied to the bases of the transistors $Q_1$ and $Q_2$. Further, a reference voltage defined by a transistor $Q_5$ is applied to the negative input terminal of the differential amplifier $IC_1$.

The transistor $Q_5$ is connected between a power supply $V_{cc}$ and the ground in series together with resistors $R_6$ and $R_7$, and arranged to apply a voltage produced between the resistor $R_6$ and the transistor $Q_5$ to the negative input terminal of the differential amplifier $IC_1$ correspondingly to a voltage applied to the base of the transistor $Q_5$.

Further, to the base of the transistor $Q_5$, applied is the output of a non-inversion amplifier constituted by resistors $R_3$ and $R_4$ and an operational amplifier $IC_2$. The output of the minimum value detection circuit d which will be described later is supplied to the positive input terminal of this non-inversion amplifier. A predetermined reference voltage ref.1 is applied to the negative input terminal of the operational amplifier $IC_2$ through the resistor $R_4$.

The monitor circuit c is constituted by a photodiode 2 supplied with the light signal outputted from the laser diode 1, and an operational amplifier $IC_3$ the input terminal and output terminal of which are connected to each other through a resistor $R_5$ so as to act as a current-to-voltage conversion amplifier. The output of the amplifier $IC_3$ is supplied to the minimum value detection circuit d and the maximum value detection circuit e which will be described later.

The minimum value detection circuit d includes an operational amplifier $IC_4$ the positive input terminal of which is supplied with a monitor signal outputted from the monitor circuit c, a diode $D_1$ the anode of which is connected to the output terminal of the operational amplifier $IC_4$, and a capacitor $C_1$ connected between the cathode of the diode $D_1$ and the ground. Further, the cathode of the diode $D_1$ and the negative input terminal of the operational amplifier $IC_4$ are short-circuited.

The minimum value detection circuit d is supplied with the output of the previous stage, and outputs a signal the value of which corresponds to the minimum value of the monitor signal outputted from the photodiode 2.

The maximum value detection circuit e includes an operational amplifier $IC_5$ the positive input terminal of which is supplied with the monitor signal outputted from the monitor circuit c, a diode $D_2$ the cathode of which is connected to the output terminal of the operational amplifier $IC_5$, and a capacitor $C_2$ connected between the anode of the diode $D_2$ and the ground. Further, the anode of the diode $D_2$ and the negative input terminal of the operational amplifier $IC_5$ are short-circuited.

The maximum value detection circuit e outputs a signal the value of which corresponds to the maximum value of the monitor signal outputted from the photodiode 2.

The bias current control circuit f is constituted by an operational amplifier $IC_6$ the positive input terminal of which is supplied with the output of the minimum value detection circuit d, and a transistor $Q_4$ the base of which is supplied with the output of the operational amplifier $IC_6$.

The emitter of the transistor $Q_4$ is connected to the ground through a resistor $R_2$, and the collector of the same is connected to a junction between the laser diode 1 and the transistor $Q_1$ in the driving circuit a. A predetermined reference voltage ref.2 is applied to the negative input terminal of the operational amplifier $IC_6$.

The modulation current control circuit g is constituted by an operational amplifier $IC_7$ the positive input terminal of which is supplied with the output of the maximum value detection circuit e, and a transistor $Q_3$ the base of which is supplied with the output of the operational amplifier $IC_7$.

The emitter of the transistor $Q_3$ is connected to the ground through a resistor $R_1$, and the collector of the same is connected to the emitters of transistors $Q_1$ and $Q_2$ in common. A predetermined reference voltage ref.3 is applied to the negative input terminal of the operational amplifier $IC_7$.

Figure 9:
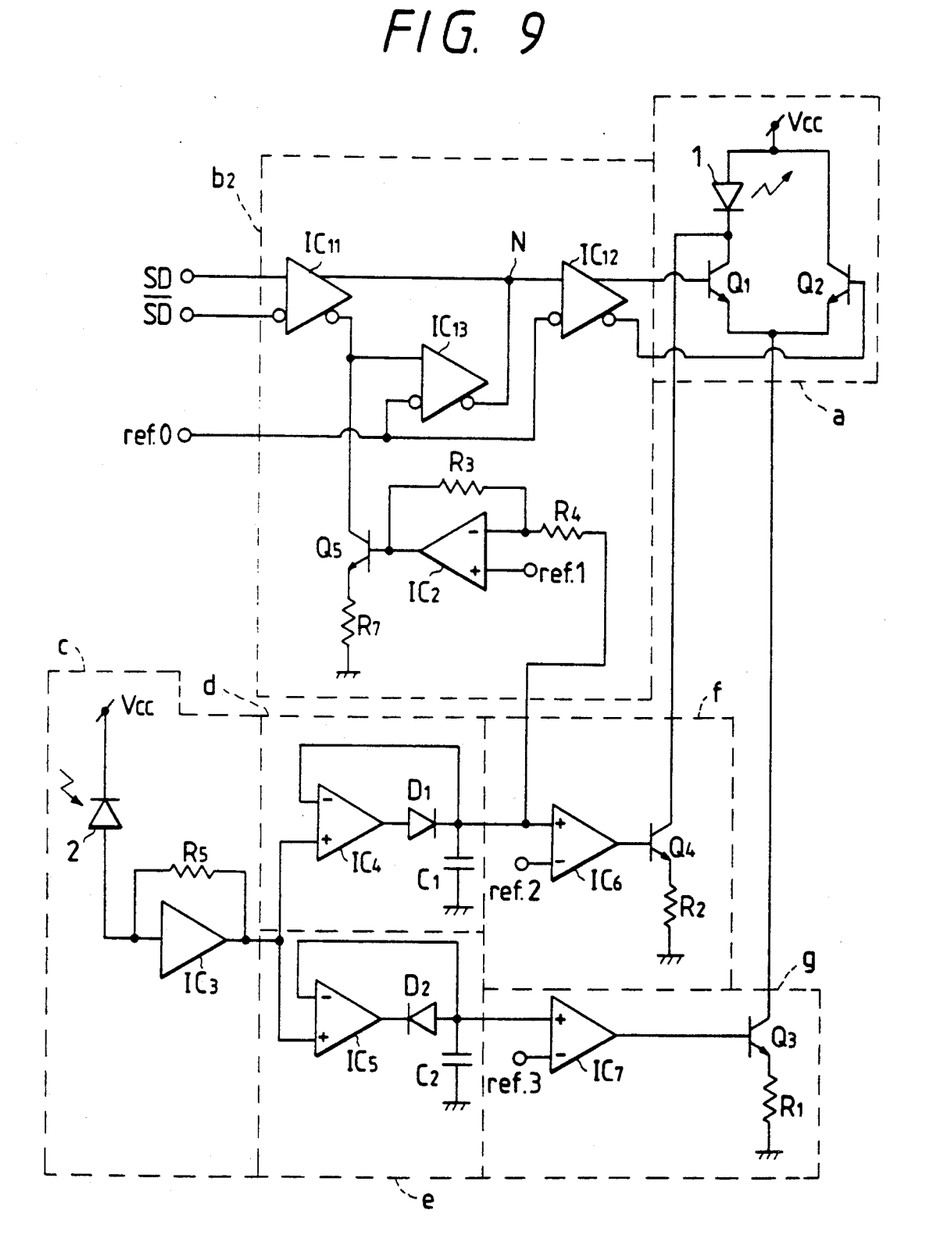
FIG. 9 is a circuit diagram illustrating another example of a specific configuration of the semiconductor laser device driving circuit shown in FIG. 7.

FIG. 9 is a circuit diagram illustrating another example of a more specific configuration of the circuit shown in FIG. 7. In FIG. 9, the difference from the semiconductor laser device driving circuit shown in FIG. 8 is mainly in the configuration of the pulse width control circuit. Therefore, other parts which are the same as those in FIG. 8 are referenced correspondingly, and the description thereof will be omitted.

As shown in FIG. 9, this semiconductor laser device driving circuit has the same configuration as that of the circuit shown in FIG. 8, except for the configuration of a pulse width control circuit $b_2$. Therefore, in the same manner as the circuit shown in FIG. 8, a monitor circuit c monitors a part of an output light signal, and on the basis of the minimum value and the maximum value detected from a monitor signal by a minimum value detection circuit d and a maximum value detection circuit e, a bias current control circuit f and a modulation current control circuit g feedback-control a bias current and a modulation current of a driving circuit a.

On the other hand, the pulse width control circuit $b_2$ has a unique configuration, and is constituted mainly by a circuit including three invertors $IC_{11}$, $IC_{12}$ and $IC_{13}$ to directly deal with an input signal pulse, and an operational amplifier $IC_2$ the negative input terminal and output terminal of which are connected to each other through a resistor $R_3$ and for transferring the output of the minimum value detection circuit d to the invertor $IC_{13}$. Being different from the operational amplifier $IC_2$ of the circuit shown in FIG. 8, the output terminal of the minimum value detection circuit d is connected to the negative input terminal of the operational amplifier $IC_2$, and the operational amplifier $IC_2$ acts as an inversion amplifier.

The invertor $IC_{11}$ is supplied with an input signal SD and an inverted signal thereof at its non-inversion input terminal and inversion input terminal, and has an inversion output terminal and a non-inversion output terminal. The non-inversion output terminal and the inversion output terminal of the invertor $IC_{11}$ are connected to the non-inversion input terminal of the invertor $IC_{12}$ and the non-inversion input terminal of the invertor $IC_{13}$ respectively. In the invertor $IC_{13}$, a reference voltage ref.0 is applied from the outside to the inversion input terminal thereof, and the inversion output terminal thereof is connected to the non-inversion input terminal of the invertor $IC_{12}$.

Therefore, the non-inversion output terminal of the invertor $IC_{11}$ and the inversion output terminal of the invertor $IC_{13}$ are connected to the non-inversion input terminal of the invertor $IC_{12}$ through a wired OR formed at a node N. The reference voltage ref.0 is also applied to the inversion input terminal of the invertor $IC_{12}$, and the complementary outputs of the invertor $IC_{12}$ are connected to the bases of the transistors $Q_1$ and $Q_2$ of the driving circuit a, respectively.

In the circuit $b_2$, the input data signal SD and the inverted signal thereof are supplied to the invertor $IC_{11}$ respectively. The inversion output of the invertor $IC_{11}$ is supplied to the non-inversion input terminal of the invertor $IC_{13}$, and the logical sum (wired OR) between the inversion output of the invertor $IC_{13}$ and the non-inversion output of the invertor $IC_{11}$ is supplied to the non-inversion input terminal of the invertor $IC_{12}$. The waveform of the inverted signal of the input signal SD is shaped on the basis of the reference voltage ref.0 by the invertor $IC_{13}$, and the further inverted signal is added to the input signal SD by the wired OR so as to be supplied to the invertor $IC_{12}$. The same reference voltage ref.0 as that supplied to inversion input terminal of the invertor $IC_{13}$ is supplied to the inversion input terminal of the invertor $IC_{12}$, and the invertor $IC_{12}$ shapes the waveform of the input signal SD on the basis of the reference voltage ref.0.

Therefore, the output signals from the complementary output terminals in pair of the invertor $IC_{12}$ are outputted each as a signal corresponding to the input signal SD, and each output signal is shaped into a signal having a pulse width corresponding to that of the input signal on which a delay component in the invertor $IC_{13}$ is superimposed.

The minimum value detection circuit d outputs a voltage inversely proportional to the change of the monitor current supplied from the photodiode 2. This voltage is inverted by the operational amplifier $IC_2$ and applied to the non-inversion input terminal of the invertor $IC_{13}$. Therefore, when the output of the minimum value detection circuit d increases, that is, when the minimum value of the output light signal of the laser diode 1 decreases, the current flowing into the transistor $Q_5$ decreases, and the delay time by the invertor $IC_{12}$ increases, so that the pulse width of an input signal supplied to the driving circuit a becomes wide. On the contrary, when the minimum value of the output light signal of the laser diode 1 increases, the current flowing into the transistor $Q_5$ increases. Therefore, the delay time caused in the invertor $IC_{12}$ decreases, so that the pulse width of the input signal supplied to the driving circuit a becomes narrow.

By the operation as mentioned above, it is possible to compensate the pulse width distortion of a light signal supplied from the laser diode.

What is claimed is:

1. A semiconductor laser device driving circuit comprising:
    a semiconductor laser device;
    detection means for detecting a luminous output of said semiconductor laser device and generating detected current signals corresponding to detected minimum and maximum luminous output values of said semiconductor laser device;
    current source means for generating a plurality of source current signals;
    reference current means for generating a plurality of reference current signals corresponding to reference maximum and minimum luminous output values of said semiconductor laser device, said plurality of reference current signals being differences between the plurality of said source current signals supplied from said current source means; and
    driving means for receiving said detected current signals and said reference current signals, generating corresponding driving current signals and supplying said driving current signals to said semiconductor laser device.

2. The semiconductor laser device driving circuit according to claim 1, wherein said current source means includes first, second and third current sources, a first reference current signal of the plurality of reference current signals being a difference between a first source current signal supplied from said first current source and a second source current signal supplied from said second current source, and a second reference current signal of the plurality of reference current signals being a difference between said first source current signal supplied from said first current source and a third source current signal supplied from said third current source.

3. The semiconductor laser device driving circuit according to claim 1, wherein said driving means includes a first differential amplifier supplied with said detected maximum luminous output value and said reference maximum luminous output value of said semiconductor laser device, and a second differential amplifier supplied with said detected minimum luminous output value and said reference minimum luminous output value of said semiconductor laser device.

4. The semiconductor laser device driving circuit according to claim 3, further comprising control means for controlling a pulse width of a modulation current for said semiconductor laser device modulated by an input signal which is based on an output of said second differential amplifier.

5. The semiconductor laser device driving circuit according to claim 1, wherein said driving means supplies a modulation current to said semiconductor laser device based on said detected and said reference maximum luminous output values of said semiconductor laser device, and supplies a bias current to said semiconductor laser device based on said detected and said reference minimum luminous output values of said semiconductor laser device.

6. The semiconductor laser device driving circuit according to claim 1, wherein said detection means includes a photodiode.

7. The semiconductor laser device driving circuit according to claim 1, further comprising control means for controlling a pulse width of a modulation current for said semiconductor laser device modulated by an input signal which is based on said detected and said reference minimum luminous output values of said semiconductor laser device.

* * * * *